(12) United States Patent
Accoto et al.

(10) Patent No.: US 12,719,471 B2
(45) Date of Patent: Aug. 25, 2026

(54) CURRENT CLAMP ON POWER DELIVERY CONTROL AND OVER CURRENT PROTECTION

(71) Applicant: Infineon Technologies Austria AG, Villach (AT)

(72) Inventors: Celso Accoto, Villach (AT); Ching Tiu Hsu, Villach (AT); Aliaksandr Subotski, Villach (AT)

(73) Assignee: Infineon Technologies Austria AG, Villach (AT)

( * ) Notice: Subject to any disclaimer, the term of this patent is extended or adjusted under 35 U.S.C. 154(b) by 26 days.

(21) Appl. No.: 18/222,906

(22) Filed: Jul. 17, 2023

(65) Prior Publication Data

US 2025/0030416 A1 Jan. 23, 2025

(51) Int. Cl.
*H03K 17/22* (2006.01)
*H03K 17/081* (2006.01)
*H03K 17/30* (2006.01)

(52) U.S. Cl.
CPC ..... *H03K 17/223* (2013.01); *H03K 17/08104* (2013.01); *H03K 17/302* (2013.01)

(58) Field of Classification Search
CPC ........... H03K 17/223; H03K 17/08104; H03K 17/302
See application file for complete search history.

(56) References Cited

U.S. PATENT DOCUMENTS 8,901,989 B2 * 12/2014 Mehta .................. H03K 17/063 327/512
11,233,502 B2 * 1/2022 Whitworth ............ H02M 3/073
2014/0092508 A1 * 4/2014 Ko ......................... H02H 9/046 361/56
2015/0162321 A1 * 6/2015 Briere .................... H02H 9/046 257/195

* cited by examiner

*Primary Examiner* — Menatoallah Youssef
*Assistant Examiner* — Colleen J O Toole
(74) *Attorney, Agent, or Firm* — Armis IP Law, LLC

(57) ABSTRACT

An apparatus such as a clamp circuit includes a first circuit component and a second circuit component. The first circuit component may be coupled to a first circuit path. The second circuit component may be coupled to the first circuit component. The second circuit component may be configured to control operation of the first circuit component such that current received from the first circuit path passes through a combination of the first circuit component and the second circuit component to a ground reference voltage. In other words, controlled operation of the first circuit component results in sinking of the current received from the first circuit path through the first circuit component and the second circuit component to the reference voltage node such as ground. In one example, the first circuit component is controlled to sink the current through the clamp circuit when a supply voltage is below a threshold level.

14 Claims, 7 Drawing Sheets

CURRENT CLAMP ON POWER DELIVERY CONTROL AND OVER CURRENT PROTECTION

BACKGROUND

A conventional switch driver circuit is typically configured to produce a respective output control signal to control operation of a respective switch such as a field effect transistor or other device.

In certain instances, the conventional switch driver circuit includes a first output pin that outputs a first driver control signal to control operation of a first switch and a second output pin that outputs a second driver control signal to control operation of a second switch. The conventional driver circuit may be configured to implement a complex and slow-to-react circuit such as one or more current mirrors to sink current associated with each driver output during conditions when a respective power supply voltage is below a threshold level.

BRIEF DESCRIPTION

This disclosure includes the observation that conventional driver circuits suffer from deficiencies. For example, without clamping protection, a driver output signal of a conventional driver circuit may randomly toggle between different drive states during power up of respective power supply. After proper power up of a respective driver, the output pins can be driven to desired ON/OFF states to control respective target one or more switches. Unintended toggling of output driver control signals during power supply startup (such as supply voltage below a threshold level) may cause undesirable activation of a respective external switch driven by the circuit, resulting in random operation of that external switch. Conventional clamping circuits such as conventional current mirror circuits are undesirable because they are complex.

Implementation of apparatuses and methods as discussed herein prevent undesirable random toggling of switch driver control signals (or any other control signals) such as during power up or power down of a respective circuit.

More specifically, an apparatus such as a clamp circuit or other suitable entity can be configured to include a first circuit component and a second circuit component. The first circuit component may be coupled to a first circuit path. The second circuit component may be coupled to the first circuit component. The second circuit component may be configured to control operation of the first circuit component such that current received from the first circuit path passes through a combination of the first circuit component and the second circuit component to a reference voltage. Thus, the combination of the first switch and the second switch can be a clamp circuit. In one embodiment, controlled operation of the first circuit component results in sinking of the current received from the first circuit path through the first circuit component and the second circuit component (such as clamp circuit) to the reference voltage node such as ground or other reference voltage.

In a further example, the first circuit component and the second circuit component are disposed in series between the first circuit path and the reference voltage node.

Yet further, the combination of the first circuit component and the second circuit component create a second circuit path. The second circuit path included an intermediate node coupling the first circuit component and the second circuit component. The second circuit component is operative to control a magnitude of a voltage applied to the intermediate node to control activation/deactivation of the first circuit component. The current flows through the intermediate node during a mode in which the second circuit component controls the first circuit component to an ON-state. The ON-state of the first circuit component results in flow of the current through the first circuit component (such as first switch) to or through the second circuit component (second switch).

In accordance with still further examples, the second circuit component can be configured to apply a voltage to a node of the first circuit component. During the activation of the first circuit component via application of the voltage, the combination of the first circuit component and the second circuit component (such as clamp circuit) sink the current from the first circuit path to the reference voltage node.

Note further that the apparatus can be configured to include a signal generator (such as a comparator) operative to generate a control signal to control operation of the second circuit component. A state of the control signal from the signal generator depends on a magnitude of a power supply input voltage that powers a circuit or circuitry in which the first circuit path resides. As previously discussed, the first circuit component can be a first switch. The signal generator can be configured to: i) compare the magnitude of the power supply input voltage (such as supply voltage) to a threshold level; and ii) produce the control signal to control the first switch to an open state in response to detecting that the magnitude of the power supply input voltage is above the threshold level.

The first circuit component can be a first switch such as a first field effect transistor; the second circuit component can be a second switch such as a second field effect transistor. A gate node of the first field effect transistor may be driven with a reference voltage (such as a static voltage) provided by (supplied from) the reference voltage node. As previously discussed, the first field effect transistor (such as first circuit component) may be disposed in series with the second field effect transistor (such as second circuit component) to produce a respective clamp circuit between the first circuit path and the reference voltage node via direct connectivity of a source node of the first field effect transistor to a source node of the second field effect transistor.

In yet further examples, the apparatus as discussed herein can be configured to include a third circuit component (such as a switch) coupled to the first circuit path. The third circuit component may be a first switch controlled independent of the first circuit component to sink the current received from the first circuit path. A series combination of the first circuit component and the second circuit component (such as clamp circuit) may be disposed in parallel with the third circuit component.

Still further, a control input node of the first circuit component (such as a gate node) can be passively driven by a static voltage signal supplied by the reference voltage node to activate the first circuit component and provide a low impedance path from the first circuit path through the first circuit component to a node coupling the first circuit component to the second circuit component.

If desired, the first circuit component may be a depletion mode field effect transistor. The first circuit component may be a high voltage depletion mode field effect transistor (such as NMOS or n-type metal-oxide-semiconductor field effect transistor).

In accordance with still further examples, the first circuit component can be a first switch or other suitable entity operative to control sinking of the current to the reference voltage node. The apparatus can be configured to include a second switch (such as a switch associated with a driver circuit disparate with respect to the first circuit component and the second circuit component). The second switch may be configured to control sinking of the current to the reference voltage node subsequent to deactivation of the first switch to an open state.

In accordance with yet another example as discussed herein, an apparatus can be configured to include a first circuit component and a second circuit component as previously discussed. The first circuit component such as a first field effect transistor is coupled to a first circuit path. The second circuit component can be configured to control a magnitude of a first voltage applied to a source node of the first field effect transistor. The magnitude of the first voltage (at the source node of the first field effect transistor) controls sinking of current from the first circuit path through the first field effect transistor and corresponding source node of the first field effect transistor to a reference voltage node. As previously discussed, controlled sinking of the current may include the current flowing from the source node of the first field effect transistor through the second circuit component to the reference voltage node.

In accordance with yet further examples as discussed herein, a second voltage supplied by the reference voltage node such as a ground reference voltage or other suitable voltage controls a gate node of the first field effect transistor. A differential voltage between the gate node of the first field effect transistor and the source node of the first field effect transistor controls a resistance between a drain node of the first field effect transistor and the source node of the first field effect transistor to sink the current from the first circuit path to the ground reference voltage.

In accordance with still further examples, a method as discussed herein includes: monitoring a magnitude of a first voltage supplied to power a circuit; and based on the magnitude of the first voltage, controlling a magnitude of a second voltage applied to a node of a first circuit component in the circuit, the first circuit component coupled to a first circuit path in the circuit, the second voltage operative to control a state of the first circuit component sinking current received from the first circuit path through the node of the first circuit component to a reference voltage node.

In one or more example as discussed herein, the first circuit component may be a first switch. Controlling the magnitude of the second voltage applied to the node of the first circuit component may include: in response to detecting that the magnitude of the first voltage (such as supply voltage) is below a threshold level, setting the magnitude of the second voltage to control the first switch to an ON-state. Conversely, in response to detecting that the magnitude of the first voltage (such as supply voltage) is above the threshold level, setting the magnitude of the second voltage to control the first switch to an OFF-state.

These and other more specific examples are disclosed in more detail below.

Note that although examples as discussed herein are applicable to driver circuitry, the concepts disclosed herein may be advantageously applied to any other suitable topologies as well as general power supply control applications.

Note further that one or more computerized devices or processors can be programmed and/or configured to operate as explained herein to carry out the different examples as described herein such as operations associated with the comparator to control a respective clamp circuit.

Yet other examples herein include software programs to perform the steps and operations summarized above and disclosed in detail below. One such example comprises a computer program product including a non-transitory computer-readable storage medium or any computer readable hardware storage medium on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, examples herein are directed to methods, systems, computer program products, etc., that support operations as discussed herein.

One example herein includes a computer readable storage hardware having instructions stored thereon. The instructions, when executed by computer processor hardware, cause the computer processor hardware (such as one or more co-located or disparately located processor devices) to: monitor a magnitude of a first voltage supplied to power driver circuitry; and based on the magnitude of the first voltage, control a magnitude of a second voltage applied to a node of a first circuit component of the driver circuitry; the first circuit component coupled to a first circuit path in the driver circuitry; the second voltage operative to control a state of the first circuit component sinking current received from the first circuit path through the node of the first circuit component to a reference voltage node.

The ordering of the steps above has been added for clarity sake. Note that any of the processing steps as discussed herein can be performed in any suitable order.

Other examples of the present disclosure include software programs and/or respective hardware to perform any of the method example steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of supporting switching power supplies. However, it should be noted that examples herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of examples herein (BRIEF DESCRIPTION) purposefully does not specify every example and/or incrementally novel aspect of the present disclosure or claimed invention(s). Instead, this brief description only presents general examples and corresponding points of novelty over conventional techniques. For additional details and/or possible perspectives (permutations) of the invention(s), the reader is directed to the Detailed Description section (which is a summary of examples) and corresponding figures of the present disclosure as further discussed below.

Figure 1:
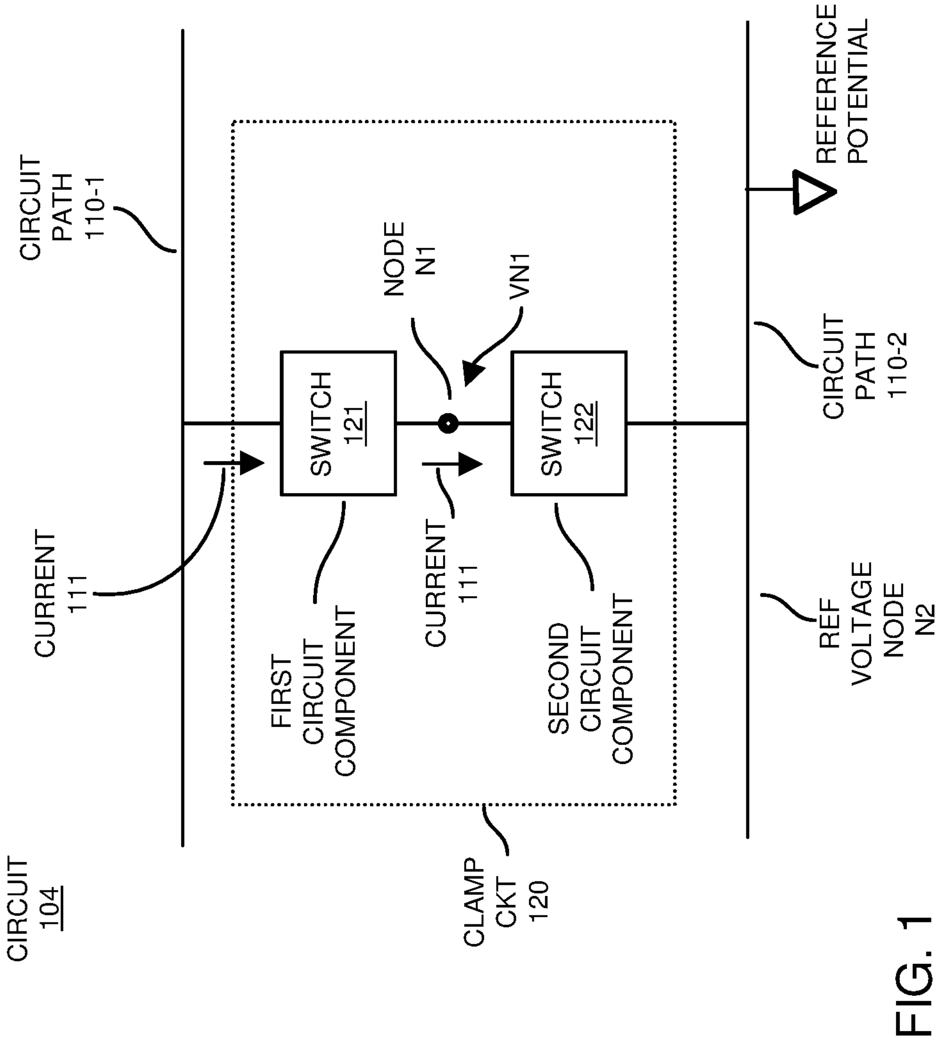
FIG. 1 is an example general diagram illustrating implementation of a general clamp circuit to provide sinking of current associated with a circuit path as discussed herein.

The foregoing and other objects, features, and advantages of the invention will be apparent from the following more particular description of preferred examples herein, as illustrated in the accompanying drawings in which like reference characters refer to the same parts throughout the different views. The drawings are not necessarily to scale, with emphasis instead being placed upon illustrating the examples, principles, concepts, etc.

DETAILED DESCRIPTION

A clamp circuit in switch driver circuitry can be configured to include a first circuit component and a second circuit component. The first circuit component may be coupled to a first circuit path of the driver circuitry. The second circuit component may be coupled to the first circuit component. The second circuit component may be configured to control operation of the first circuit component such that current received from the first circuit path passes through a clamp circuit such as combination of the first circuit component and the second circuit component to a reference voltage. In such an instance, controlled activation of the first circuit component results in sinking of the current received from the first circuit path through the first circuit component and the second circuit component to the reference voltage node such as ground or reference voltage.

In one example as further discussed herein, the first circuit component is controlled to sink the current from the first circuit path to keep the voltage of the first circuit path to 0 volts or other reference voltage when a supply voltage powering the driver circuitry is below a threshold level. For example, during power up or power down of the switch driver circuitry when the supply voltage is below a respective threshold level, the clamp circuit as discussed herein can be configured to sink any current from the first circuit path to a ground or other reference voltage. Thus, the drive signal is set to a known state during under-voltage conditions as opposed to randomly toggling.

As further discussed herein, a specific example of the clamp circuit may be a passive clamp circuit requiring only 2 transistors, one transistor being passively driven, the other being actively driven with a control signal. When activated, the clamp circuit as discussed herein sinks a defined current for the defined voltage on a respective pin of a driver circuit. Yet further, as discussed herein, implementation of a clamp circuit on each driver circuit path is very desirable to keep switches (such as FETs) inactive in a DC/DC converter while supply voltages are not properly settled. For instance, the dV/dt (change in a magnitude of the) input supply rail(s) may cause accidental activation of the external FETs driven by a driver circuit leading to uncontrolled delivery of power to the power supply, high shoot through currents and FET's overstress. The clamp circuit as discussed herein and corresponding clamping (via sinking of current) maintains respective FET's gate-source voltage at sufficiently low levels, preventing accidental switch activation and maintaining system robustness and reliability.

Yet further, advantageously, the one or more instances of clamp circuits as discussed herein do not consume current when the system is up and running and allows creation of a necessary low-ohmic path to sink current during an under-voltage condition without an effect on system efficiency.

Now, more specifically, FIG. 1 is an example general diagram illustrating implementation of a clamp circuit to provide sinking of current associated with a circuit path as discussed herein.

In this example, the circuit 104 includes circuit path 110-1, circuit path 110-2, switch 121 (i.e., a first circuit component), and switch 122 (i.e., a second circuit component). In general, the clamp circuit 120 includes a series connectivity circuit path of the switch 121 and the switch 122 between the circuit path 110-1 and the circuit path 110-2. More specifically, the switch 121 is coupled between the first circuit path 110-1 and the intermediate node N1; the switch 122 is coupled between the intermediate node N1 and the second circuit path 110-2. The second circuit path 110-2 is a reference voltage node N2 such as a ground reference voltage (or other reference voltage potential).

As further discussed herein, the clamp circuit 120 provides controlled sinking of current 111 from the circuit path 110-1 to the circuit path 110-2 such as during one or more conditions of operating the circuit 104.

Thus, as discussed herein, an apparatus such as a clamp circuit or other suitable entity can be configured to include a first circuit component (such as switch 121) and a second circuit component (such as switch 122). The first circuit component may be coupled to a first circuit path 110-1 (such as layer of metal, circuit trace, electrically conductive path, etc.). The second circuit component (switch 122) may be coupled to the first circuit component. The second circuit component may be configured to control operation of the first circuit component such that current 111 received from the first circuit path 110-1 passes through a combination of the first circuit component and the second circuit component to a reference voltage associated with circuit path 110-2 (reference voltage node N2). The circuit path 110-2 may be implemented as one or more layers of metal, circuit traces, electrically conductive paths, etc.

As further discussed herein, controlled operation of the switch 121 results in sinking of the current 111 received from the first circuit path 110-1 through the first switch 121 and the second switch 122 to the reference voltage node N2.

In such an instance, the voltage of the circuit path 110-1 is maintained at a voltage of around 0 VDC (such as GND) or at least below a threshold value with respect to a reference voltage of the circuit path 110-2.

Figure 2:
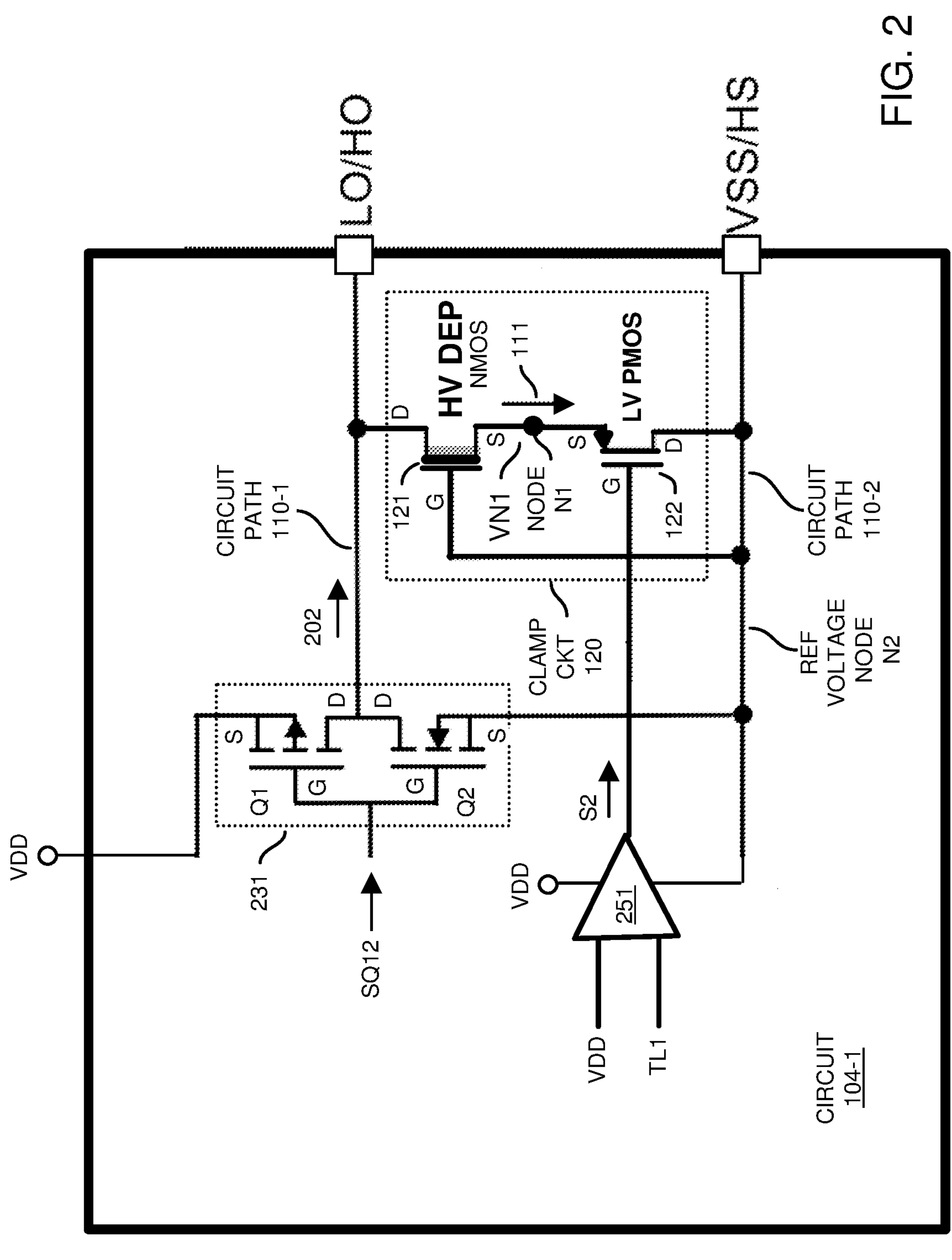
FIG. 2 is an example general diagram illustrating implementation of a specific clamp circuit in a driver circuit to provide sinking of current associated with a driver circuit path as discussed herein.

FIG. 2 is an example general diagram illustrating implementation of a clamp circuit in a driver circuit to provide sinking of current associated with a driver circuit path as discussed herein.

In this example, the clamp circuit 120 is implemented in circuit 104-1 such as driver circuitry or other suitable type of circuit device (hardware and/or software). The circuit 104-1 is powered by the supply voltage VDD (a.k.a., power supply input voltage such as 12 VDC or other suitable value).

As further shown, the circuit 104-1 is referenced to ground or reference such as voltage VSS. In addition to including the clamp circuit 120, the circuit 104-1 includes signal generator 231 and comparator 251 (a.k.a., signal generator producing signal S2).

The signal generator 231 such as a switch driver in this example includes switch Q1 and switch Q2 connected in series between the supply voltage VDD (source) and the reference voltage (such as around 0 VDC or other suitable reference value) associated with the reference voltage node N2 (also known as circuit path 110-2, ground reference, floating reference, or voltage VSS).

As further shown, the source node S of the switch Q1 is directly coupled to a source providing the supply voltage VDD; the drain node D of the switch Q1 is directly coupled to the drain node D of the switch Q2 and corresponding circuit path 110-1; the source node S of the switch Q2 is directly coupled to the reference voltage node N2.

During operation, the signal generator 231 receives the input signal SQ12. The input control signal SQ12 can be received from any suitable entity. When the input signal SQ12 is a logic high, the switch Q2 is set to the ON-state and the switch Q1 is set to an OFF-state. In such an instance, the circuit path 110-1 is connected to the reference voltage node N2 in which the output signal 202 from port LO/HO is therefore set to 0 VDC.

Conversely, when the input signal SQ12 is a logic low, the switch Q1 of signal generator 231 is set to the ON-state and the switch Q2 is set to an OFF-state. In such an instance, the circuit path 110-1 is connected to the supply voltage VDD and the output pin LO/HO and corresponding signal 202 is therefore set to the supply voltage VDD.

Thus, the circuit 104-1 as discussed herein can be configured to include a third circuit component (such as switch Q2 of the signal generator 231 or driver circuit) coupled to the first circuit path 110-1. The third circuit component may include or is a switch Q2 controlled independent of the switch 121 to sink the current received from the first circuit path 110-1 to the reference voltage node N2. A series combination of the first switch 121 and the second switch 122 (such as clamp circuit 120) is disposed in parallel with the switch Q2 of the signal generator 231.

As further shown, when the supply voltage VDD is below a threshold level TL1, it is desirable to set a magnitude of the signal 202 to a logic low state of 0 VDC (ground) via clamp circuit 120 to prevent undesirable toggling of the signal 202 outputted from the output pin LO/HO. As previously discussed, circuit 104-1 includes clamp circuit 120 to maintain a magnitude of the signal 202 to a logic low during conditions in which the magnitude of the supply voltage VDD is less than the threshold level TL1. For example, as further discussed below, during start-up or power-down of a respective power supply when the supply voltage VDD is less than the threshold level TL1, the clamp circuit 120 sinks current 111 from the circuit path 110-1 to the reference voltage node N2 (circuit path 110-2). This sets the signal 202 to a logic low or OVDC.

More specifically, as shown in FIG. 2, the comparator 251 compares the magnitude of the supply voltage VDD (a.k.a., input voltage) to a respective threshold level TL1. When the magnitude of the supply voltage VDD is less than the threshold level TL1, the comparator 251 produces the signal S2 to be a logic low. During such a condition, when the magnitude of the control signal S2 is a logic low, the switch 122 is activated to an ON-state providing a low impedance path between the source node S of the switch 122 and the drain node D of the switch 122 (such as a low voltage PMOS field effect transistor). As further shown, note that the gate node G of the switch 121 is connected to the ground reference voltage node N2. In such an instance, the voltage at intermediate node N1 controls a state of the switch 121.

The switch 121 can be a so-called high voltage depletion mode field effect transistor (such as NMOS or n-type field effect transistor) that is normally in an ON-state until it is actively driven at its gate G to an OFF-state. In other words, when the gate to source voltage of the switch 121 is 0, the switch 121 is ON. In this example, because the magnitude of the voltage at the gate node G of the switch 121 is fixed to 0 VDC, the magnitude of the voltage at intermediate node N1 controls whether the switch 121 is in an ON-state or an OFF-state.

For example, as previously discussed, the gate node G of the switch 121 is set to 0 VDC. The comparator 251 produces the signal S2 to be a logic low voltage until the magnitude of the supply voltage VDD is above the threshold level TL1. In such an instance, the low voltage from the comparator 251 to the gate node G of the switch 122 causes switch 122 to be ON. Under such circumstances, the activation of the switch 122 causes the voltage at intermediate node N1 to be set equal to 0 volts DC or other low voltage with respect to the reference voltage. For example, the voltage VN1 at the intermediate node N1 will be as low as the threshold voltage (Vth) of the PMOS transistor 122, or a voltage able for the device to carry the desired current. During this condition, the gate to source voltage associated with switch 121 is OVDC (for example, the gate node of switch 121 is ground or a low voltage and the voltage VN1 at node N1 is ground or a low as well) and the corresponding switch 121 is still set to an ON-state, sinking any current 111 associated with the circuit path 110-1 through the clamp circuit to the ground reference voltage.

However, when the magnitude of the supply voltage VDD eventually raises above the threshold level TL1, the comparator 251 produces the signal S2 to be a logic high. This causes the deactivation of switch 122 and an increase of the voltage at intermediate node N1 to a logic high as well. Recall that switch 121 is normally ON when the gate to source voltage of the switch 121 is 0 volts DC. However, when the voltage of the intermediate node N1 is not connected to the ground reference voltage and becomes a logic high voltage greater than 0 VDC, the gate to source voltage associated with the switch 121 becomes a sufficiently negative voltage, causing the switch 121 to be deactivated to the OFF-state.

Thus, the clamp circuit 120 provides sinking of current 111 from the circuit path 110-1 to the reference voltage node N2 when the magnitude of the supply voltage VDD is less than the threshold level TL1. The sinking of the current 111 causes the magnitude of the voltage at circuit path 110-1 to be 0 volts DC. Conversely, the clamp circuit 120 is prevented from sinking current 111 from the circuit path 110-1 to the reference voltage node N2 (circuit path 110-2) when the magnitude of the supply voltage VDD is greater than the threshold level TL1 because the switch 121 and switch 122 are both in the OFF-state. Note further that the signal generator 231 controls a magnitude of the voltage 202 of the circuit path 110-1 when the clamp circuit 120 is not sinking current 111 to control an external switch.

Accordingly, a state of the control signal S2 from comparator 251 depends on a magnitude of a power supply input voltage VDD that powers a circuit 104-1 or circuitry in which the first circuit path 110-1 resides. As previously discussed, the first circuit component as discussed herein can be a first switch 121. The comparator 251: i) compares the magnitude of the power supply input voltage (i.e., supply voltage VDD) to a threshold level TL1; and ii) produces the control signal S2 to control the first switch 121 to an open state (OFF-state) in response to detecting that the magnitude of the power supply input voltage VDD is above the threshold level TL1.

Still further, as previously discussed, a control input node (such as a gate node G) of the first switch can be passively driven by a static voltage signal (0 VDC or ground reference voltage) supplied by the reference voltage node N2. If desired, the first switch 121 may be a depletion mode field effect transistor such as an n-type field effect transistor.

Thus, a clamp circuit 120 as discussed herein can be configured to provide a passive clamp for the gate of an external field effect transistor normally driven by a gate driver circuit (such as signal generator 231) through the LO/HO output pin. Because the clamp circuit 120 is passive, the clamp circuit 120 provides sinking of current 111 even during conditions in which the supply voltage VDD is below the threshold level TL1. In contrast to conventional techniques of implementing current mirrors, the clamp circuit 120 as discussed herein has no limitation in the response time by nature, as the clamping current 111 is directly generated by the clamping voltage on the circuit path 110-1 as it builds up.

Additionally, the second switch 122 effectively applies or controls a magnitude of the voltage at intermediate node N1 depending on whether the switch 122 is ON or OFF. During the activation of the switch 121, via application or control of the voltage VN1 at intermediate node N1, the combination of the switch 121 and the switch 122 sink the current 111 from the first circuit path 110-1 to the reference voltage node N2. As previously discussed, the sinking of current 111 prevents buildup of a voltage on the circuit path 110-1.

In accordance with another operational view of the clamp circuit 120, the switch 121 and switch 122 are disposed in a second circuit path including an intermediate node N1 coupling the source node S of switch 121 to the source node S of switch 122. As previously discussed, the control signal S2 and corresponding switch 122 control a magnitude of the voltage applied at the intermediate node N1 to control activation/deactivation of the switch 121. The current 111 flows through the intermediate node N1 during the mode in which the second circuit component controls the switch 121 to an ON-state. The ON-state of the switch 121 results in flow of the current 111 through the switch 121 to the switch 122.

With further reference to FIG. 2, the proposed passive clamp on the one or more output (LO/HO), ensures a proper clamping of the driver output pins when no supply voltage is applied to the driver.

In this implementation, a depletion NMOS (such as switch 121) is used as part of the clamp circuit 120. The switch 121 is driven on its source terminal (source node S) by the control signal S2 or "Clamp ctrl", via a properly sized switch 122 such as PMOS (p-type) field effect transistor.

The signal S2 can be, for example, the UVLO (under-voltage low flag). In such an instance, in the situation where the supply is not present, and/or the supply voltage VDD is below the operating threshold level, the under-voltage low comparator 251 produces a low output (signal S2), and the clamp on the pins LO/HO is active, sinking the amount of current 111 defined by the voltage condition.

The clamping function associated with the clamp circuit 120 therefore is deactivated (UVLO's comparator 251 gives a high output) when the local supply is high enough for the proper operation of the internal circuitry.

The advantage of this solution is simplicity in which only 2 transistors (such as switch 121 and switch 122) achieve the intended clamping function (clamp circuit); there is no current consumption; the clamping voltage can be changed easily but is limited in the minimum value by the Vth of the devices. Here the PMOS device (such as switch 122) is setting the minimum voltage level of node VN1 by its Vgs needed to carry the required current; on the other hand, the switch 121 such as a HV depletion N channel field effect transistor is also able to conduct current with even a small negative gate to source voltage, which in this case is set by the PMOS (switch 122) in series.

Figure 3:
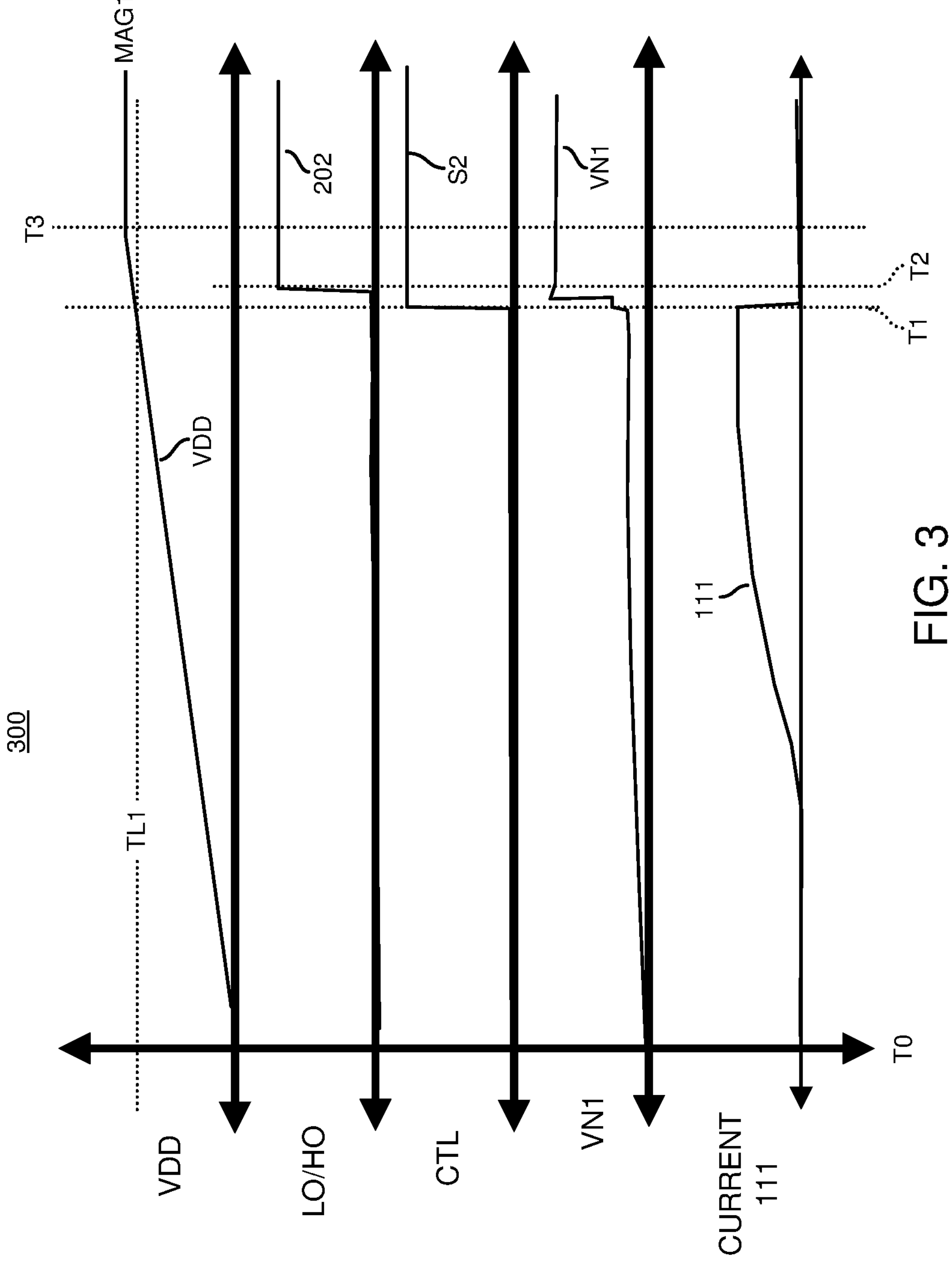
FIG. 3 is an example timing diagram illustrating activation of a clamp circuit during an under-voltage condition of powering a driver circuit as discussed herein.

FIG. 3 is an example timing diagram illustrating activation of a clamp circuit during an under-voltage condition of powering a driver circuit as discussed herein.

In this example of timing diagram 300, assume that the supply voltage VDD ramps from 0 volts at time TO to a voltage of MAG1 (target voltage) at time T3. Because the magnitude of the supply voltage VDD is less than the threshold level TL1 between time TO and time T1, the comparator 231 produces the output signal S2 to be a logic low between time T0 and time T1.

As further shown, the magnitude of the current 111 generally increases up until time T1, sinking any excess current from the circuit path 110-1 in a manner as previously discussed. In response to the comparator 251 setting the signal S2 to a logic high at time T1, the voltage VN1 of the intermediate node N1 becomes greater than zero around time T1. This causes shut off of the switch 121 based on the gate to source voltage of the switch 121 being negative. In other words, as previously discussed, the gate node G of the switch 121 is set to a reference voltage such as 0 VDC. Increase of the voltage VN1 to a positive voltage such as 3 VDC or other suitable value at or around time T1 results in shutting of the switch 121. Thus, eventually, setting of the control signal S2 to a logic high at time T1 results in shut off of the switch 122 and discontinued flow of clamping current 111. After time T1, because the clamp circuit 120 is OFF (i.e., there is a high impedance between the circuit path 110-1 and the circuit path 110-2), the signal generator 231 is able to control a state of the circuit path 110-1 from a high voltage to a low voltage (such as ground) via producing the signal 202 to any desired state because the clamp circuit is no longer activated.

Thus, controlling the magnitude of the voltage VN1 applied to the intermediate node N1 of the switch 121 may include: in response to detecting that the magnitude of the supply voltage VDD is below the threshold level TL1, the comparator 251 sets the voltage magnitude of the signal S2 voltage to control the switch 121 to an ON-state, and in response to detecting that the magnitude of the supply voltage VDD is above the threshold level TL1, the comparator 251 sets the voltage magnitude of the signal S2 voltage to control the switch 121 to an OFF-state.

Figure 4:
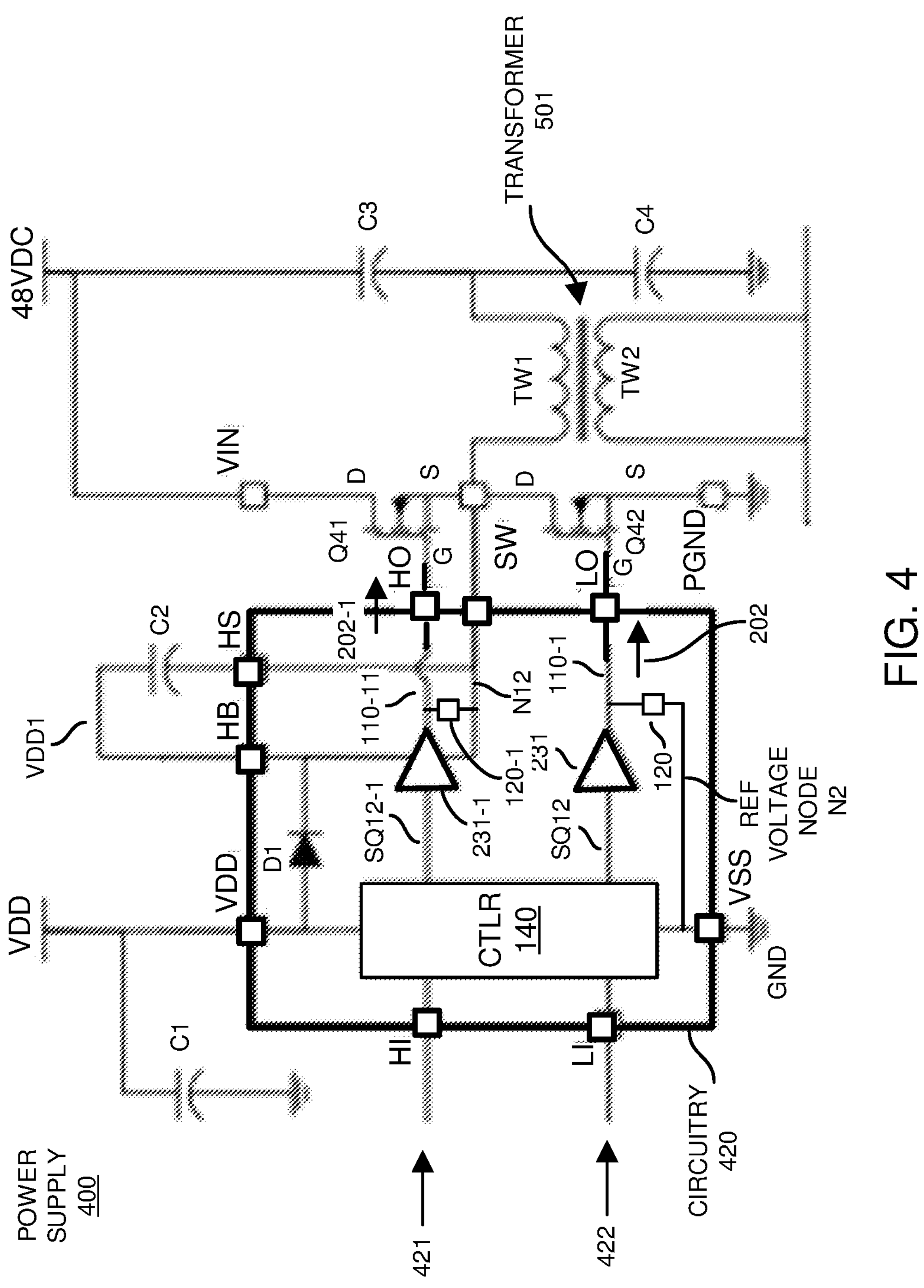
FIG. 4 is an example circuit diagram illustrating implementation of a switch driver circuit and multiple clamp circuits to provide corresponding clamping to multiple circuit paths as discussed herein.

FIG. 4 is an example circuit diagram illustrating implementation of a driver to control switches in a power supply as discussed herein.

In this example, the power supply 400 includes the circuitry 420 (such as a switch driver), capacitor C1, capacitor C2, external switch Q41, external switch Q42, transformer 401 (including transformer winding TW1 magnetically coupled to transformer winding TW2), and capacitor C3. The driver circuitry 420 includes controller 140, diode D1, signal generator 231, signal generator 231-2, clamp circuit 120, and clamp circuit 120-1.

After the supply voltage VDD is greater than the threshold level TL1, switching of the switches Q41 and Q42 by the controller 140 at appropriate times results in power converter of the input voltage VIN to an output voltage.

In a manner as previously discussed, prior to the magnitude of the supply voltage VDD being above a threshold level TL1, the clamp circuit 120 sinks current 111. For example, when the magnitude of the supply voltage VDD is less than the threshold level TL1, the clamp circuit 120 sinks current 111 from the circuit path 110-1 to node N2 to prevent undesirable activation of the switch Q42. After the supply voltage VDD raises above the threshold level TL1, the controller 140 uses the received signal 422 to control an operation of the switch Q42. For example, as further shown, the circuitry 420 receives the input control signal 422 to control operation of the switch Q42 after the supply voltage VDD is above the threshold level TL1. In such an instance, the controller 140 generates the control signal SQ12 based on the magnitude of the received input control signal 422 to produce the signal 202 outputted from the output pin LO; the signal 202 drives the gate of switch Q42 and controls its operation.

Yet further in this example, the circuitry 420 includes clamp circuit 120-1 to clamp current associated with the circuit path 110-11 to the node N12 (i.e., a reference voltage node). Generally, operation of the clamp circuit 120-1 is the same as previously discussed for the clamp circuit 120. However, the voltage source to power the signal generator 231-1 is based on the supply voltage VDD1 (received from the capacitor C2) and the reference voltage at node N12.

More specifically, in this example, the circuitry 420 implements clamp circuit 120-1 to sink current from the circuit path 110-11 to the node N12 when the magnitude of the supply voltage VDD (or VDD1) is less than the threshold level TL1. In other words, in a manner as previously discussed, clamp circuit 120-1 sinks current 111-1 (see FIG. 5 for current 111-1) prior to the magnitude of the supply voltage VDD (or VDD1) being above a threshold level TL1. After the supply voltage VDD (or VDD1) is above the threshold level TL1, the controller 140 controls a state of the switch Q41 based on the input control signal 421. In other words, the controller 140 generates the control signal SQ12-1 based on the magnitude of the received input control signal 421 (at the input pin HI) after the clamp circuit 120-1 is deactivated. Based on the control signal SQ12-1, the signal generator 231-1 produces the signal 202-1 outputted from the output port HO, which drives the gate G of switch Q41. The control signal 202-1 thus controls a state of the switch Q41. As previously discussed, as also shown in FIG. 5, when the magnitude of the supply voltage VDD is less than the threshold level TL1, the clamp circuit 120-1 sinks current 111-1 to intermediate node N12 to prevent undesirable activation of the switch Q41 when a magnitude of the supply voltage VDD is less than the threshold level TL1.

As further shown in FIG. 4, the signal generator 231-1 operates based on supply voltage VDD1 received from the capacitor C2. The node N12 (or circuit path N12) is a reference voltage node, which floats with respect to the ground reference voltage. In other words, the reference at node N12 is SW volts. The diode D1 supplies current and voltage from the received supply voltage VDD to the capacitor C2, which is referenced to the reference voltage node N12. The supply voltage VDD1 (basically supply voltage VDD minus a diode drop associated with diode D1) powers the signal generator 231-1 as further shown in FIG. 5.

Figure 5:
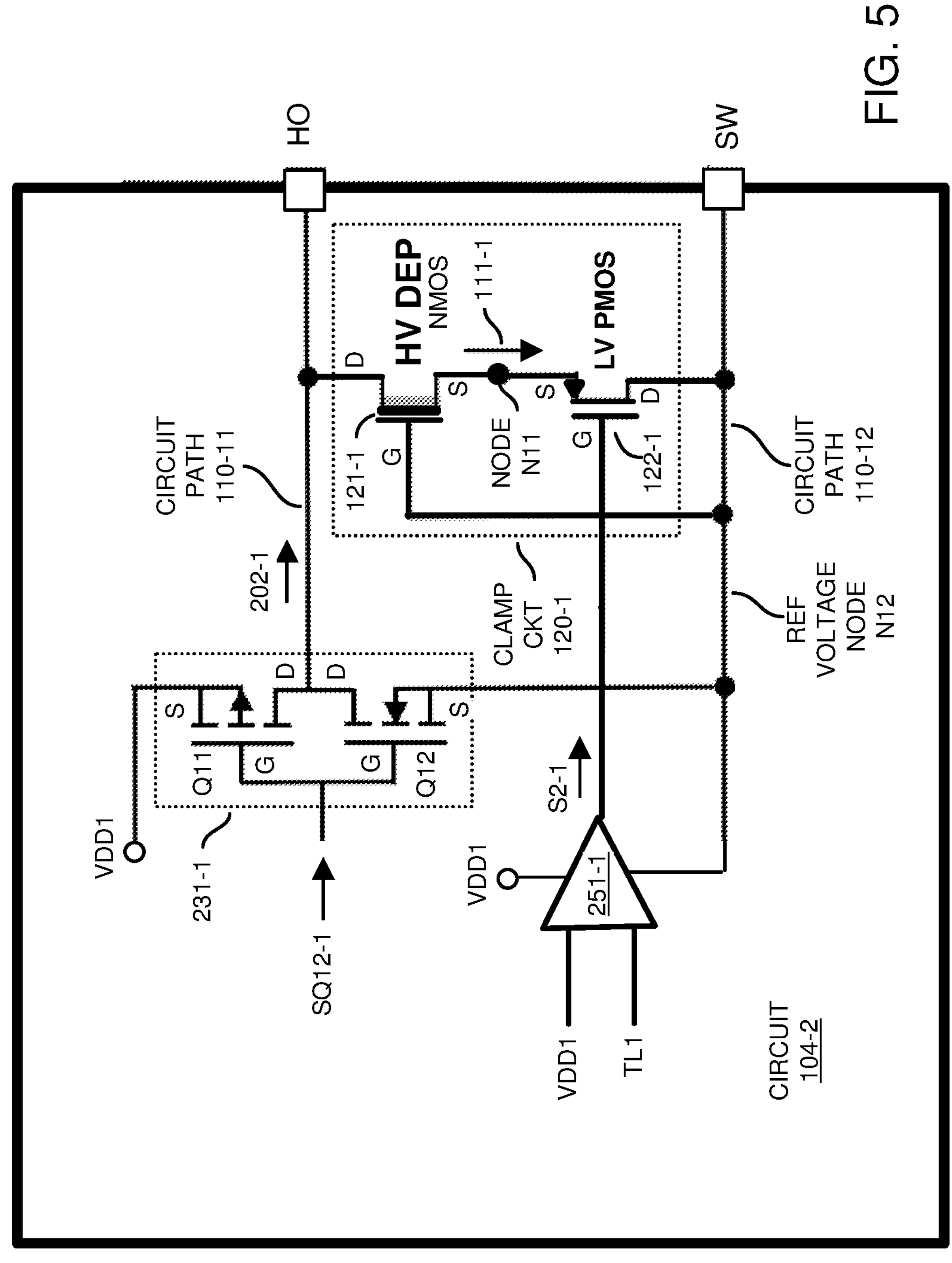
FIG. 5 is an example general diagram illustrating implementation of a clamp circuit in a driver circuit to provide sinking of current associated with a driver circuit path as discussed herein.

FIG. 5 is an example general diagram illustrating implementation of a clamp circuit in a driver circuit to provide sinking of current associated with a driver circuit path as discussed herein.

In this example, the clamp circuit 120-1 is implemented in circuitry 420 such as driver circuitry or other suitable type of circuit device (hardware and/or software). In this example, signal generator 231-1 is powered by the supply voltage VDD1.

As further shown, the circuit 104-2 is referenced to reference voltage SW at node N12. In addition to including the clamp circuit 120-1, the circuitry 420 includes signal generator 231-1 and comparator 251-1 (a.k.a., signal generator producing signal S2-1).

The signal generator 231-1 such as a signal driver in this example includes switch Q11 and switch Q12 connected in series between the supply voltage VDD1 (source) and the reference voltage SW associated with the reference voltage node N12 (also known as circuit path 110-12).

As further shown, the source node S of the switch Q11 is directly coupled to a source providing the supply voltage VDD1; the drain node D of the switch Q11 is directly coupled to the drain node D of the switch Q12 and corresponding circuit path 110-11; the source node S of the switch Q12 is directly coupled to the reference voltage node N12 or circuit path 110-12.

During operation, the signal generator 231-1 receives the input signal SQ12-1. The input control signal SQ12-1 can be received from any suitable entity. When the input signal SQ12-1 is a logic high, the switch Q12 is set to the ON-state and the switch Q11 is set to an OFF-state. In such an instance, the circuit path 110-11 is connected to the reference voltage node N12 in which the output signal 202-1 from port HO is therefore set to reference voltage SW VDC.

Conversely, when the input signal SQ12-1 is a logic low, the switch Q11 of signal generator 231-1 is set to the ON-state and the switch Q12 is set to an OFF-state. In such an instance, the circuit path 110-11 is connected to the supply voltage VDD1 and the output port HO and corresponding signal 202-1 is therefore set to the supply voltage VDD1.

As further shown, when the supply voltage VDD1 is below a threshold level TL1, it is desirable to set a magnitude of the signal 202-1 to a logic low state of SW VDC to prevent undesirable toggling of the signal 202-1 outputted from the output pin HO. As previously discussed, circuitry 420 includes clamp circuit 120-1 to maintain a magnitude of the signal 202-1 to a logic low (voltage SW) during conditions in which the magnitude of the supply voltage VDD1 is less than the threshold level TL1. For example, during start-up or power-down of a respective power supply when the supply voltage VDD1 is less than the threshold level TL1, the clamp circuit 120-1 sinks current 111-1 from the circuit path 110-11 to the reference voltage node N12 (circuit path 110-2). This sets the signal 202-1 to a logic low or SW VDC and prevents turn on of the switch Q41 driven by the signal 202-1 (see FIG. 4 as well).

More specifically, as shown in FIG. 5, the comparator 251-1 compares the magnitude of the supply voltage VDD1 (a.k.a., input voltage) to a respective threshold level TL1. When the magnitude of the supply voltage VDD1 is less than the threshold level TL1, the comparator 251-1 produces the signal S2-1 to be a logic low. During such a condition, when the magnitude of the control signal S2-1 is a logic low, the switch 122-1 is activated to an ON-state providing a low impedance path between the source node S of the switch 122-1 and the drain node D of the switch 122-1 (such as a low voltage PMOS field effect transistor). The gate node G of the switch 121-1 is connected to the SW reference voltage at node N12. In such an instance, the voltage at intermediate node N11 controls a state of the switch 121-1.

Note that the switch 121-1 can be a so-called high voltage depletion mode field effect transistor (such as NMOS or n-type field effect transistor) that is normally in an ON-state until it is actively driven at its gate G to an OFF-state. In this example, because the magnitude of the voltage at the gate node G of the switch 121-1 is fixed to SW VDC associated with the reference voltage node N12, the magnitude of the voltage at intermediate node N11 controls whether the switch 121-1 is in an ON-state or an OFF-state.

For example, as previously discussed, the gate node G of the switch 121-1 is statically set to the reference voltage SW VDC. The comparator 251-1 produces the signal 202-1 to be a logic low voltage (SW VDC) until the magnitude of the supply voltage VDD1 is above the threshold level TL1. In such an instance, the low voltage from the comparator 251-1 to the gate node G of the switch 122-1 causes switch 122-1 to be ON. Under such circumstances, the activation of the switch 122-1 causes the voltage at intermediate node N11 to be set equal to SW volts DC or other low voltage. During this condition, the drain to source voltage associated with switch 121-1 is OVDC and the corresponding switch 121-1 is still set to an ON-state, sinking any current 111-1 associated with the circuit path 110-11 through the clamp circuit 120-1 to the reference voltage SW.

However, when the magnitude of the supply voltage VDD1 raises above the threshold level TL1, the comparator 251-1 produces the signal S2-1 to be a logic high (such as VDD1 volts). This causes the deactivation of switch 122-1 and an increase of the voltage at intermediate node N11 to a logic high. Recall that switch 121-1 is normally ON when the gate to source voltage of the switch 121-1 is 0 volts DC. However, when the voltage of the intermediate node N11 is not connected to the reference voltage SW and becomes a logic high voltage greater than SW VDC, the gate to source voltage associated with the switch 121-1 becomes a sufficiently negative voltage, causing the switch 121-1 to be deactivated to the OFF-state.

Thus, the clamp circuit 120-1 provides sinking of current 111-1 from the circuit path 110-11 to the reference voltage node N12 when the magnitude of the supply voltage VDD1 is less than the threshold level TL1. The sinking of the current 111-1 causes the magnitude of the voltage at circuit path 110-11 to be SW volts DC. Conversely, the clamp circuit 120-1 is prevented from sinking current 111-1 from the circuit path 110-11 to the reference voltage node N12 when the magnitude of the supply voltage VDD1 is greater than the threshold level TL1 because the switch 121-1 and switch 122-1 are both in the OFF-state. At such time, the signal generator 231-1 controls a magnitude of the voltage 202-1 of the circuit path 110-11 (when the clamp circuit 120-1 is not sinking current 111-1) to control an external switch.

The proposed passive clamp on the outputs (HO), ensures a proper clamping of the driver output pins (circuit path 202-1) when no supply voltage VDD1 is applied to the driver (signal generator 231-1) or the supply voltage VDD1 is less than a threshold level TL1.

In this implementation a depletion NMOS field effect transistor (such as switch 121-1) is used as part of the clamp circuit 120-1. The switch 121-1 is driven on its source terminal (source node S) by the control signal S2-1 or "Clamp ctrl", via a properly sized switch 122-1 such as PMOS (p-type) field effect transistor.

The signal S2-1 can be, for example, the UVLO flag. In such an instance, in the situation where the supply VDD1 is not present, and/or it is below the operating threshold level, the under-voltage low comparator 251-1 produces a low output (signal S2-1), and the clamp on the output pin HO is active, sinking the amount of current 111-1 defined by the voltage condition.

The clamping function associated with the clamp circuit 120-1 therefore is deactivated (UVLO's comparator gives a high output) when the local supply VDD1 is high enough for the proper operation of the internal circuitry.

The advantage of this solution is simplicity in which implementation of only 2 transistors achieves an intended clamping function; there is no current consumption; the clamping voltage can be changed easily but is limited in the minimum value by the Vth of the devices. Here the PMOS device (such as switch 122-1) is setting the minimum voltage level of node N11 by its Vgs needed to carry the required current; on the other hand, the switch 121-1 such as a HV depletion N channel field effect transistor is also able to conduct current with even a small negative gate to source voltage, which in this case is set by the PMOS (switch 122-1).

Figure 6:
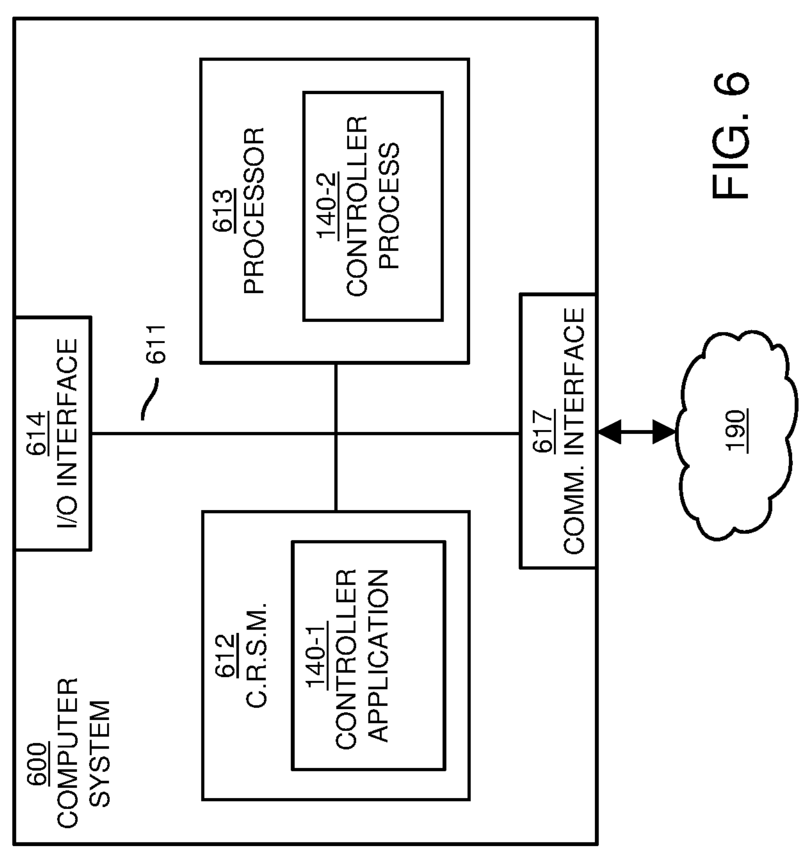
FIG. 6 is an example diagram illustrating computer processor hardware and related software instructions that execute methods according to examples herein.

FIG. 6 is an example block diagram of a computer device for implementing any of the operations as discussed herein according to examples herein.

As shown, computer system 600 and controller application 140-1 (such as implementing one or more functions such as associated with controller 140, comparator 251, comparator 251-1, etc., and providing corresponding control of one or more resources such as signal generators 231 and 231-1, clamp circuit 120, clamp circuit 120-1, etc.) of the present example includes an interconnect 611 that couples computer readable storage media 612 such as a non-transitory type of media (or hardware storage resource) in which digital information can be stored and retrieved, a processor 613 (e.g., computer processor hardware such as one or more processor devices), I/O interface 614, and a communications interface 617.

I/O interface 614 provides connectivity to any suitable circuitry such as input pins receiving input control signals, signal generators, clamp circuits, etc.

Computer readable storage medium 612 (such as computer-readable storage hardware) can be any hardware storage resource or device such as memory, optical storage, hard drive, floppy disk, etc. In one example, the computer readable storage medium 612 stores instructions and/or data used by the controller application 140-1 to perform any of the operations as described herein.

Further in this example, communications interface 617 enables the computer system 600 and processor 613 to communicate over a resource such as network 190 to retrieve information from remote sources and communicate with other computers.

As shown, computer readable storage media 612 is encoded with controller application 140-1 (e.g., software, firmware, etc.) executed by processor 613. Controller application 140-1 can be configured to include instructions to implement any of the operations as discussed herein.

During operation of one example, processor 613 accesses computer readable storage media 612 via the use of interconnect 611 in order to launch, run, execute, interpret or otherwise perform the instructions in controller application 140-1 stored on computer readable storage medium 612.

Execution of the controller application 140-1 produces processing functionality such as controller process 140-2 in processor 613. In other words, the controller process 140-2 associated with processor 613 represents one or more aspects of executing controller application 140-1 within or upon the processor 613 in the computer system 600.

In accordance with different examples, note that computer system 600 can be a micro-controller device, logic, hardware processor, hybrid analog/digital circuitry, etc., configured to control a power supply and perform any of the operations as described herein.

Functionality supported by the different resources will now be discussed via flowchart in FIG. 7. Note that the steps in the flowcharts below can be executed in any suitable order.

Figure 7:
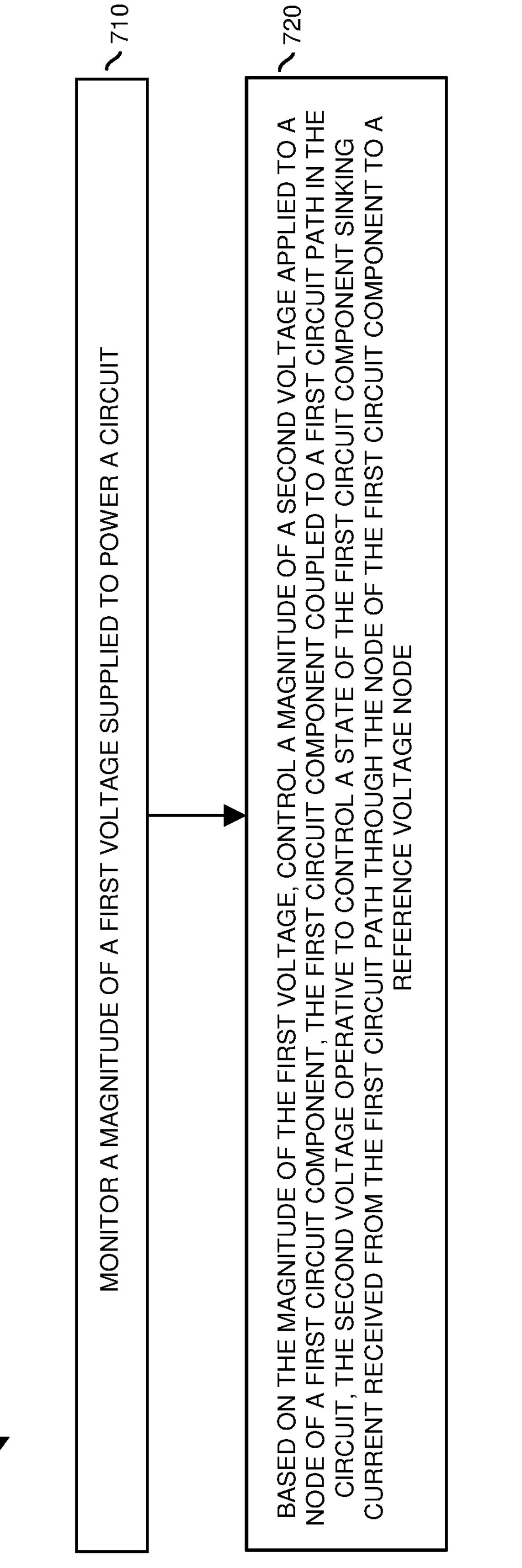
FIG. 7 is an example diagram illustrating a method according to examples herein.

FIG. 7 is an example diagram illustrating a method to control sinking of current as discussed herein.

In processing operation 710, the comparator 251 (such as part or controller 140) monitors a magnitude of a supply voltage VDD supplied to power the circuit 420.

In processing operation 720, based on the magnitude of the supply voltage VDD, the comparator 251 controls a magnitude of a voltage at intermediate node N1 of the switch 121. As previously discussed, the switch 121 is coupled to the circuit path 110-1 in the circuit 104-1. The voltage at intermediate node N1 controls a state of the first switch 121 and corresponding sinking of current 111 received from the circuit path 110-1 through the intermediate node N1 of the to a reference voltage node N2 (such as circuit path 110-2).

Note that the controller application can be configured to control operation of the clamp circuit 120-1 in a similar manner as controlling clamp circuit 120.

Note again that techniques herein are well suited for providing clamping protection associated with a circuit. However, it should be noted that examples herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing." "computing." "calculating." "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred examples thereof, it will be understood by those skilled in the art that various changes in form and details may be made therein without departing from the spirit and scope of the present application as defined by the appended claims. Such variations are intended to be covered by the scope of this present application. As such, the foregoing description of examples of the present application is not intended to be limiting. Rather, any limitations to the invention are presented in the following claims.

The invention claimed is:

1. An apparatus comprising:

a first circuit component coupled to a first circuit path;

a second circuit component coupled to the first circuit component, the second circuit component operative to control activation of the first circuit component to sink current received from the first circuit path through the second circuit component to a reference voltage node;

wherein the first circuit component is a first field effect transistor;

wherein the second circuit component is a second field effect transistor;

wherein a gate node of the first field effect transistor is driven with a reference voltage supplied by the reference voltage node; and wherein the first field effect transistor is disposed in series with the second field effect transistor between the first circuit path and the reference voltage node via direct connectivity of a source node of the first field effect transistor to a source node of the second field effect transistor.

2. The apparatus as in claim 1, wherein the first circuit component and the second circuit component are disposed in a second circuit path including an intermediate node coupling the first circuit component and the second circuit component; and wherein the second circuit component is operative to control a magnitude of a voltage applied to the intermediate node to control activation/deactivation of the first circuit component.

3. The apparatus as in claim 2, wherein the current flows through the intermediate node during a mode in which the second circuit component controls the first circuit component to an ON-state, the ON-state of the first circuit component resulting in flow of the current through the first circuit component to the second circuit component.

4. The apparatus as in claim 1, wherein the second circuit component is operative to, during the activation of the first circuit component, apply a voltage to a node of the first circuit component to sink the current through the second circuit component to the reference voltage node.

5. A signal generator operative to generate a control signal to control operation of the second circuit component in claim 1, a state of the control signal depending on a magnitude of a power supply input voltage supplied to power circuitry in which the first circuit path resides.

6. The signal generator as in claim 5, wherein the first circuit component is a first switch; and wherein the signal generator is a comparator operative to: i) compare the magnitude of the power supply input voltage to a threshold level; and ii) produce the control signal to control the second circuit component to an open state in response to detecting that the magnitude of the power supply input voltage is above the threshold level, the open state of the second circuit component operative to control the first switch to an open state.

7. The apparatus as in claim 1 further comprising:

a third circuit component coupled to the first circuit path, the third circuit component being a switch device controlled independent of the first circuit component to sink the current received from the first circuit path to the reference voltage node; and wherein a series combination of the first circuit component and the second circuit component are disposed in parallel with the third circuit component.

8. The apparatus as in claim 1, wherein the first circuit component is a depletion mode field effect transistor.

9. The apparatus as in claim 1, wherein the first circuit component is a first switch operative to control sinking of the current to the reference voltage node, the apparatus further comprising:

a second switch operative to control sinking of the current to the reference voltage node subsequent to deactivation of the first switch to an open state.

10. A method comprising:

monitoring a magnitude of a first voltage supplied to power a circuit;

based on the magnitude of the first voltage, controlling a magnitude of a second voltage applied to a first node of a first circuit component, the first node of the first circuit component coupled directly to a second circuit component, a second node of the first circuit component directly coupled to a first circuit path in the circuit, application of the second voltage to the first node of the first circuit component operative to control a state of the first circuit component sinking current received from the first circuit path through the first node of the first circuit component to a reference voltage node;

wherein the first circuit component is a first switch; and wherein controlling the magnitude of the second voltage applied to the first node of the first circuit component includes: in response to detecting that the magnitude of the first voltage is below a threshold level, setting the magnitude of the second voltage to control the first switch to an ON-state.

11. The method as in claim 10, wherein the second circuit component is a second switch; and wherein the first node of the first circuit component is a source node.

12. The method as in claim 11, wherein the second circuit component is a second field effect transistor; and wherein the first node of the second circuit component is a source node of the second field effect transistor.

13. An apparatus comprising:

a first circuit component coupled to a first circuit path:

a second circuit component coupled to the first circuit component, the second circuit component operative to control activation of the first circuit component to sink current received from the first circuit path through the second circuit component to a reference voltage node;

wherein a drain node of the first field effect transistor is directly connected to the first circuit path; and wherein a drain node of the second field effect transistor is directly connected to the reference voltage node.

14. The apparatus as in claim 13, wherein the current is first current, the apparatus further comprising:

a signal generator operative to generate a control signal supplied to a gate node of the second field effect transistor, a state of the control signal depending on a magnitude of a power supply input voltage supplied to power a switch circuit, the switch circuit operative to control delivery of second current through the first circuit path; and wherein the signal generator includes a comparator operative to: i) compare the magnitude of the power supply input voltage to a threshold level; and ii) produce the control signal to control the second field effect transistor to an OFF-state in response to detecting that the magnitude of the power supply input voltage is above the threshold level, the OFF-state of the second field effect transistor operative to control the first field effect transistor to an OFF-state.

* * * * *